(12) United States Patent
Sears

(10) Patent No.: US 8,752,437 B2
(45) Date of Patent: Jun. 17, 2014

(54) MAGNET STRENGTH MEASUREMENT

(75) Inventor: Christopher M. S. Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 133 days.

(21) Appl. No.: 13/416,333

(22) Filed: Mar. 9, 2012

(65) Prior Publication Data

US 2012/0234109 A1    Sep. 20, 2012

Related U.S. Application Data

(60) Provisional application No. 61/474,384, filed on Apr. 12, 2011, provisional application No. 61/453,045, filed on Mar. 15, 2011.

(51) Int. Cl.
*G01B 7/16* (2006.01)
(52) U.S. Cl.
USPC .................. 73/779; 73/862.381; 324/260
(58) Field of Classification Search
USPC ............... 73/779, 862.381, 862.69, 862.391; 324/245–261
See application file for complete search history.

(56) References Cited

U.S. PATENT DOCUMENTS

| | | | | |
|---|---|---|---|---|
| 4,849,696 A * | 7/1989 | Brun et al. | ..................... | 324/252 |
| 5,182,515 A * | 1/1993 | Okada | ........................... | 324/259 |
| 5,475,305 A * | 12/1995 | Jiles et al. | ..................... | 324/227 |
| 5,520,052 A * | 5/1996 | Pechersky | ....................... | 73/579 |
| 5,883,587 A * | 3/1999 | Ikemoto | ........................ | 340/988 |
| 6,529,019 B1 | 3/2003 | King et al. | | |
| 6,879,152 B2 | 4/2005 | Hitachi | | |
| 7,317,314 B2 * | 1/2008 | Zimmermann et al. | ...... | 324/209 |
| 7,602,178 B2 * | 10/2009 | Hehn et al. | .................... | 324/252 |
| 7,898,243 B2 * | 3/2011 | Werner | ................. | 324/207.22 |
| 8,218,272 B2 * | 7/2012 | Martchevskii | .................. | 361/19 |
| 8,452,412 B2 * | 5/2013 | Ibrahim | .......................... | 607/60 |
| 8,482,283 B2 * | 7/2013 | Grodzki | ....................... | 324/309 |
| 2009/0170065 A1 | 7/2009 | Roel et al. | | |

FOREIGN PATENT DOCUMENTS

WO    2011021521    2/2011

* cited by examiner

*Primary Examiner* — Max Noori
(74) *Attorney, Agent, or Firm* — Luedeka Neely Group P.C.; Rick Barnes

(57) ABSTRACT

An apparatus for determining an integral strength of a magnet, including a magnetically attractive specimen, a force-sensing device for receiving the specimen and determining a magnitude of a first force applied by the specimen against the force-sensing device in the presence of the magnet and a magnitude of a second force applied by the specimen against the force-sensing device in the absence of the magnet, and a platform for receiving the magnet and for positioning the magnet at a desired distance above the specimen.

19 Claims, 5 Drawing Sheets

MAGNET STRENGTH MEASUREMENT

This application claims all rights on and priority to U.S. provisional patent applications 61/453,045 filed 2011 Mar. 15 and 61/474,384 filed 2011 Apr. 12. This invention relates to the field of instrumentation. More particularly, this invention relates to determining the strength of a magnet by comparing the weight of a magnetically attractive specimen in the presence of the magnet to the weight of the specimen in the absence of the magnet.

FIELD

Background

One method for determining the strength of a magnet is to measure the magnetic field or magnetic flux density of the magnet at various discrete points across the surface of the magnet. Measuring magnetic flux can be accomplished using an instrument known as a Hall Effect probe. The Hall probe can be used to sense the magnetic flux that is present in a given area. The Hall probe is often a wand-shaped device that is placed at or near the surface of the magnet and reads the magnetic flux density in that area. In particular, the Hall probe measures the maximum flux density or the peak magnetic strength in that given area. The Hall probe is connected to a device known as a flux density meter, or a gaussmeter. The gaussmeter converts the magnetic flux readings collected from the Hall probe into a voltage. The voltage is proportional to the magnitude of the magnetic field in that given area.

Most magnets have two poles, namely a north pole and a south pole. Magnetic flux is considered to flow from the north pole of the magnet to the south pole of the magnet. The density of the magnetic field typically varies over the surface of the magnet, and is generally greater at the poles of the magnet. Therefore, to accurately measure the strength of a magnet using the Hall probe, several measurements must be taken along the entire surface of the magnet.

This method of measuring magnetic strength, however, provides the magnetic strength of a magnetic at only a single point for each measurement. Therefore, many measurements are required to obtain an accurate measurement of the total magnetic strength. Additionally, this method does not take into account any geometric variations that the magnet may have. Further, because the field strength measured is a function of the angle at which the probe is placed relative to the direction of the field as it flows from pole to pole, error can be introduced when this angle varies. Additionally, the Hall probe and gaussmeter are often very delicate instruments that can be easily damaged or broken.

What is needed, therefore, is a system that tends to reduce problems such as those described above, at least in part.

SUMMARY

The above and other needs are met by an apparatus for determining an integral strength of a magnet, including a magnetically attractive specimen, a force-sensing device for receiving the specimen and determining a magnitude of a first force applied by the specimen against the force-sensing device in the presence of the magnet and a magnitude of a second force applied by the specimen against the force-sensing device in the absence of the magnet, and a platform for receiving the magnet and for positioning the magnet at a desired distance above the specimen.

As the term is used herein, "integral strength" refers to a strength measurement of the entire magnet and not simply the flux (for example) at a single point of the magnet. Additionally, the testing apparatus described herein tends to be more robust, less expensive, and easier to operate than previous testing equipment.

According to various embodiments according to this aspect of the invention, the specimen comprises a material selected from the group consisting essentially of a diamagnetic material, a paramagnetic material, a ferromagnetic material, and an antiferromagnetic material. In some embodiments the force-sensing device is one of a mass scale and a force gauge. In some embodiments the platform includes a specimen tray for receiving and positioning the magnet. In some embodiments the platform is formed of a non-magnetically attractive material. In some embodiments the platform receives and positions more than one magnet. In some embodiments the platform includes adjustment means for varying the desired distance.

According to another aspect of the invention there is described a method of determining the integral strength of a magnet by placing a magnetically attractive specimen onto a force-sensing device, measuring an initial force applied by the specimen against the force-sensing device using the force-sensing device, positioning a magnet at a desired distance above the specimen and opposite the force-sensing device and measuring a second force applied by the specimen against the force-sensing device using the force-sensing device, and comparing the initial force to the second force, thereby determining the integral strength of the magnet.

DRAWINGS

Further advantages of the invention are apparent by reference to the detailed description when considered in conjunction with the figures, which are not to scale so as to more clearly show the details, wherein like reference numbers indicate like elements throughout the several views, and wherein.

DESCRIPTION

The various embodiments of the present invention provide a method for determining what is referred to herein as the integral strength of the magnet instead of the strength at multiple individual points across the surface of the magnet.

Figure 1:
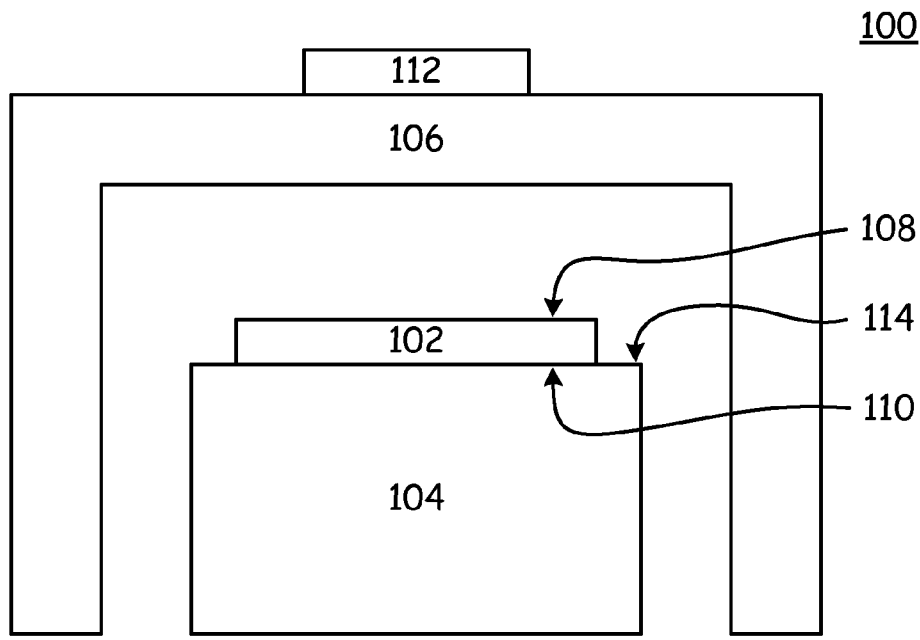
FIG. 1 is a front elevation view of a first embodiment of a measurement system according to the present invention.

With reference now to FIG. 1, there is depicted a first embodiment of a measuring system 100 for determining the integral strength of a magnet 112, according to the present invention. The measuring system 100 is comprised of a plurality of components. Such components in their broadest context include a magnetically attractive specimen 102, a force-sensing device 104, and a platform 106. Such components are individually configured and correlated with respect to each other so as to attain the desired objective.

The magnetically attractive specimen 102 has a top surface 108 and a bottom surface 110. The magnetically attractive specimen 102 comprises, at least in part, a magnetically attractive material such as, for example, at least one of a ferromagnetic material, an antiferromagnetic material, a paramagnetic material, and a diamagnetic material. In some embodiments, the magnetically attractive specimen comprises a ferromagnetic material, such as iron or steel, because ferromagnetic materials tend to provide the strongest magnetic attraction, which tends to provide for simpler operation during and better results from the testing procedure. In some embodiments the specimen 102 has an irregular geometric configuration. In other embodiments the specimen 102 has a uniform height, such as a flat plate.

The magnetically attractive specimen 102 is dimensioned and configured to exert an applied force onto the force-sensing device 104. In some embodiments, the force-sensing device 104 includes a measuring surface 114 that is designed to contact and position the specimen 102. As depicted in FIG. 1, the bottom surface 110 of the specimen 102 is positioned onto measuring surface 114. In some embodiments, the bottom surface 110 and the measuring surface 114 are smooth and substantially planar so as to provide greater surface contact between the specimen 102 and the force-sensing device 104.

In some embodiments, the force-sensing device 104 is an off-the-shelf device, such as a scale or force gauge, that is readily available and simple to use. In some embodiments, the force-sensing device 104 has a high resolution and provides a high precision measurement. Appropriate devices may include, for example, a mass scale or force gauge having a 1-milligram resolution. In those embodiments using a force gauge, the force gauge is placed between the magnet 112 and the specimen 102.

Figure 2:
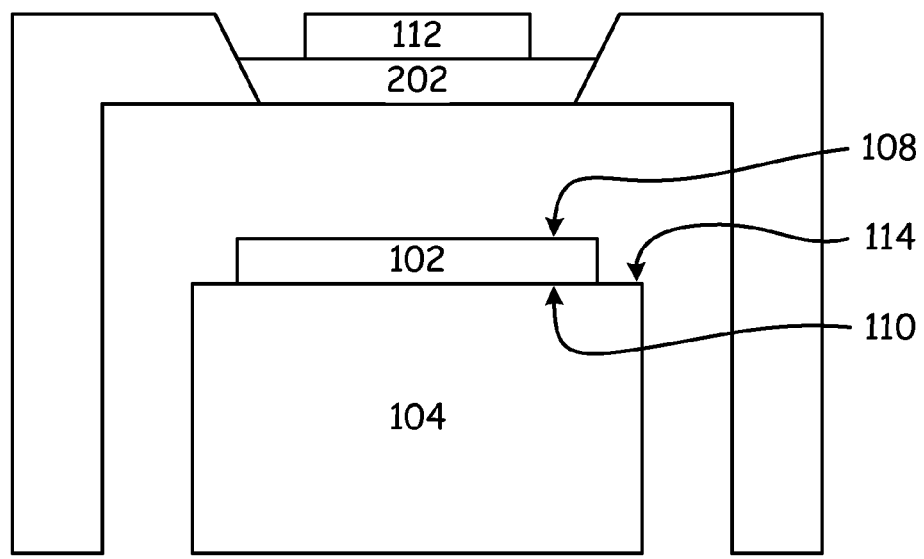
FIG. 2 is a front elevation view of a second embodiment of a measurement system according to the present invention, including a tray portion.
Figure 3:
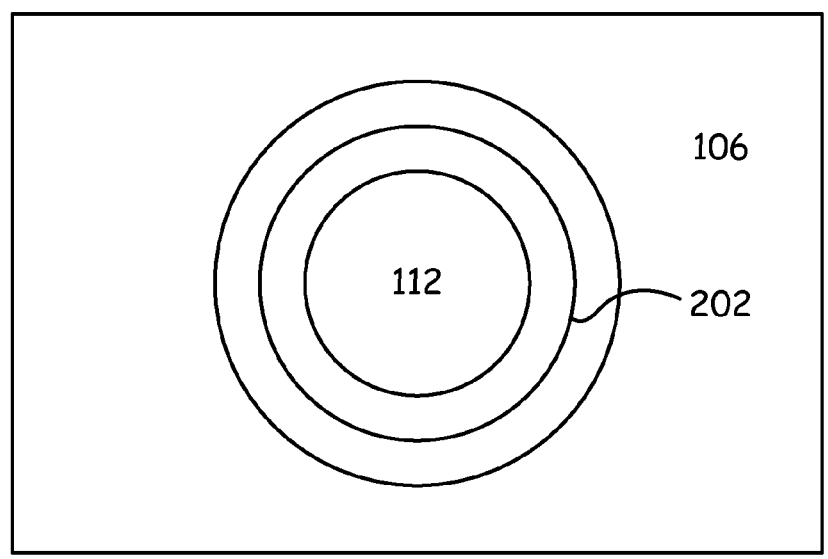
FIG. 3 is a top plan view of the second embodiment.

A platform 106 holds the magnet 112 for testing. In some embodiments, the platform 106 extends upwards and over the specimen 102 and force-sensing apparatus 104, and at least a portion of the platform 106 is positioned substantially vertically above the specimen 102 and force-sensing apparatus 104 with respect to gravity, so as to be able to hold the magnet 112 in a like position. In some embodiments, as depicted in FIGS. 2 and 3, a tray 202 holds the magnet 112. The tray 202 may be integrated into the platform 106, or it may be removable from the platform 106. In some embodiments, the platform 106 is fabricated from materials that are neither susceptible to magnetic attraction nor significantly block the magnetic force exerted by the magnet 112.

Figure 4:
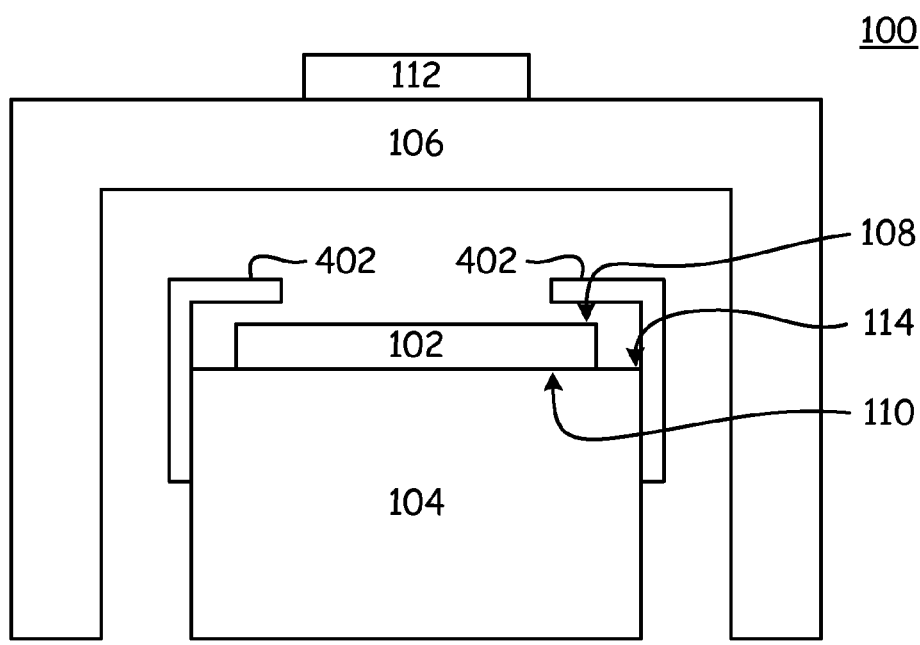
FIG. 4 is a front elevation view of a third embodiment of a measurement system according to the present invention, including restraints for the specimen.
Figure 5:
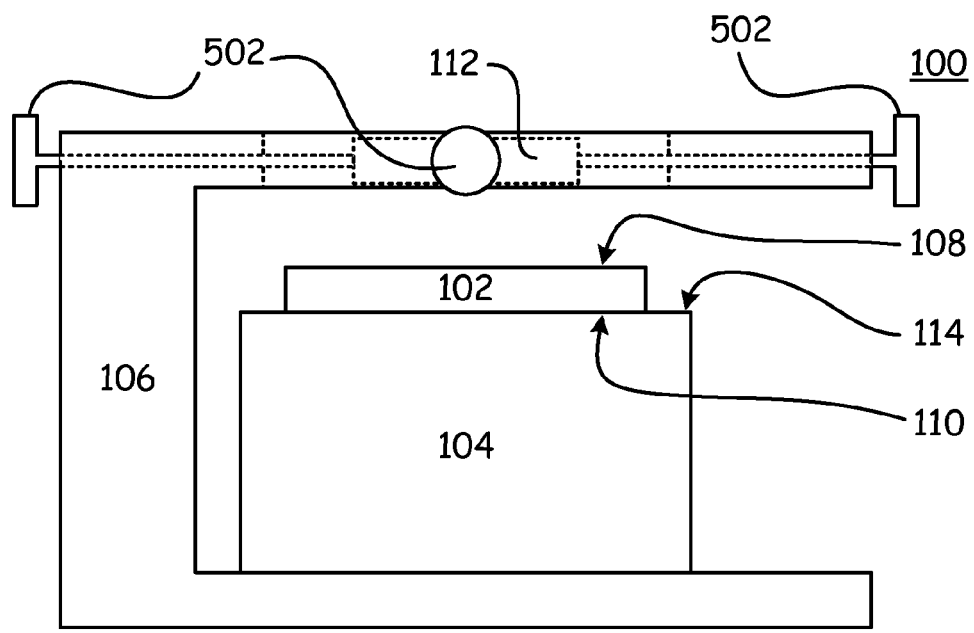
FIG. 5 is a front elevation view of a fourth embodiment of a measurement system according to the present invention, including restraints for the magnet.
Figure 6:
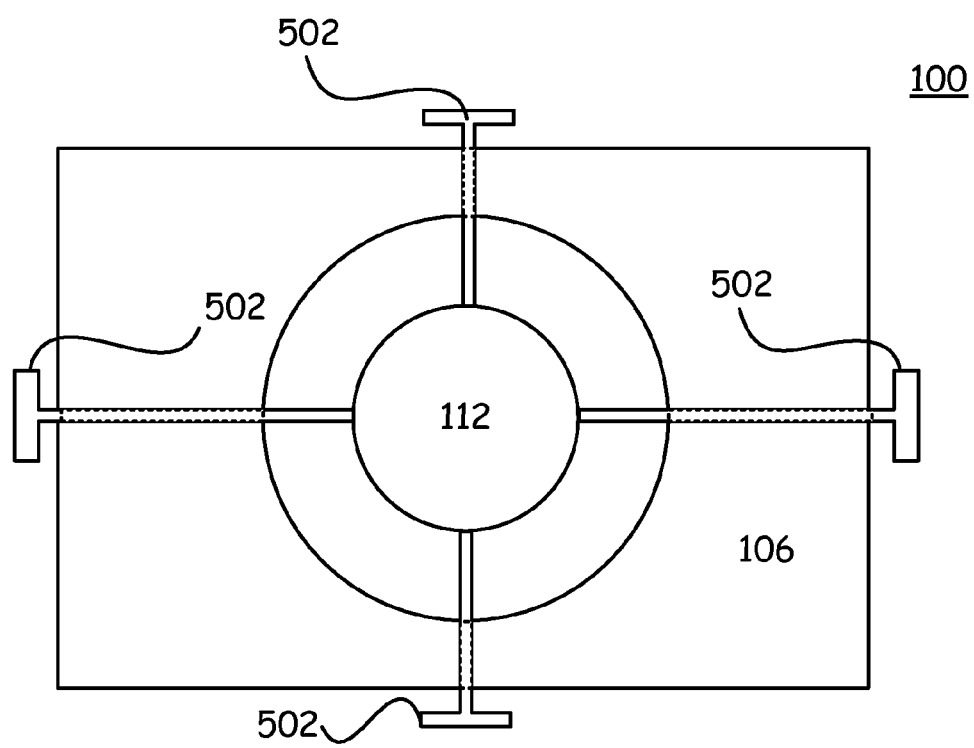
FIG. 6 is a top plan view of the fourth embodiment.

The tray 202 generally holds and positions the magnet 112 above the specimen 102 and the force-sensing device 104 throughout the measurement procedure. In some embodiments, elements are used to restrain at least one of the magnet 112 and the specimen 102. Restraining the specimen 102 or the magnet 112 tends to keep these components steady and in proper position throughout the measurement procedure. Restraining the specimen 102 may be accomplished using specimen restraints 402, such as depicted in FIG. 4. It is noted that the restraints 402 would not clamp the specimen 102 against the force-sensing device 104, as this would defeat the purpose of the apparatus 100. Restraining the magnet 112 may be accomplished using magnet restraints 502, such as depicted in FIGS. 5 and 6, in which the magnet restraints 502 comprise screw clamps.

Figure 7:
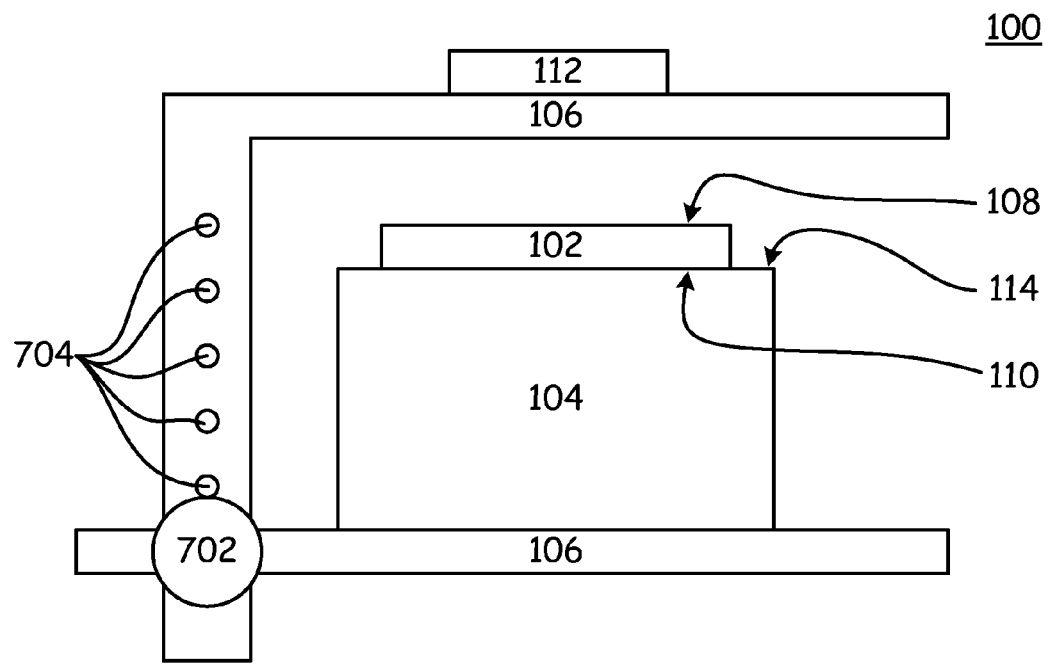
FIG. 7 is a side elevation view of a fifth embodiment of a measurement system according to the present invention, including an adjustable platform.
Figure 8:
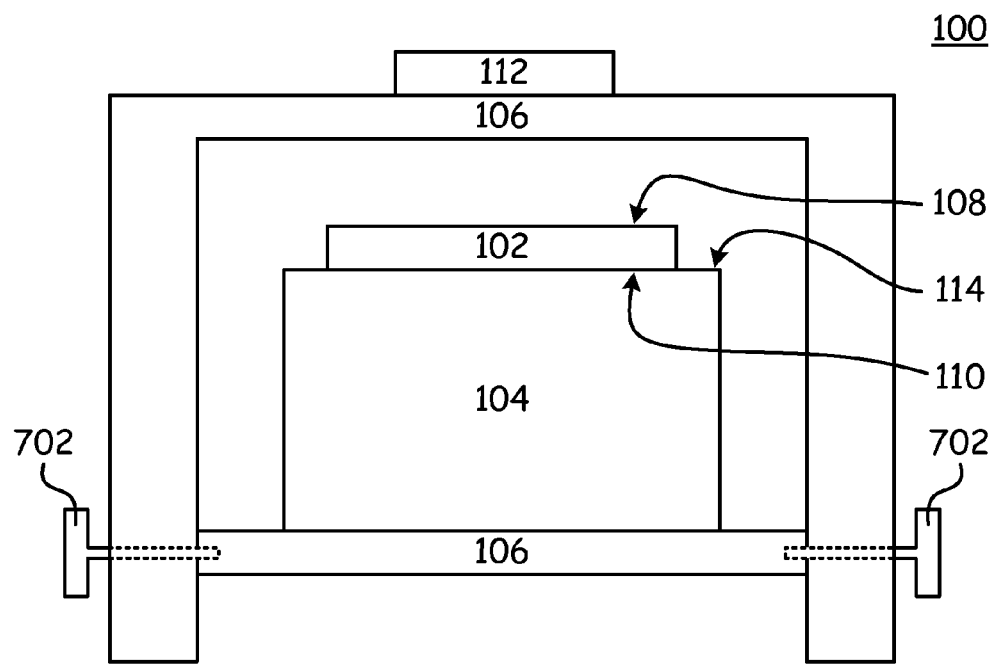
FIG. 8 is a front elevation view of the fifth embodiment.

In some embodiments, the platform 106 holds the magnet 112 at a fixed height, while in other embodiments the height is adjustable. As depicted in the embodiment of FIGS. 7 and 8, the height of the platform 106 is adjusted using an adjustment member 702 that allows a portion of the platform 106 to be raised and lowered or otherwise maneuvered. As depicted in the embodiment of FIGS. 7 and 8, the platform 106 is pre-drilled with a plurality of holes 704 that are sized for a pin 702. To adjust the platform 106, the pins 702 are first removed from the holes 704. Next, the platform 106 is raised or lowered as desired, and then the pins 702 are replaced in the platform 106 at the desired location. Alternately, instead of a pin, the adjustment member 702 may comprise a screw, a clamp, a ramp, a series of notches, or an adjustment wheel.

Figure 9:
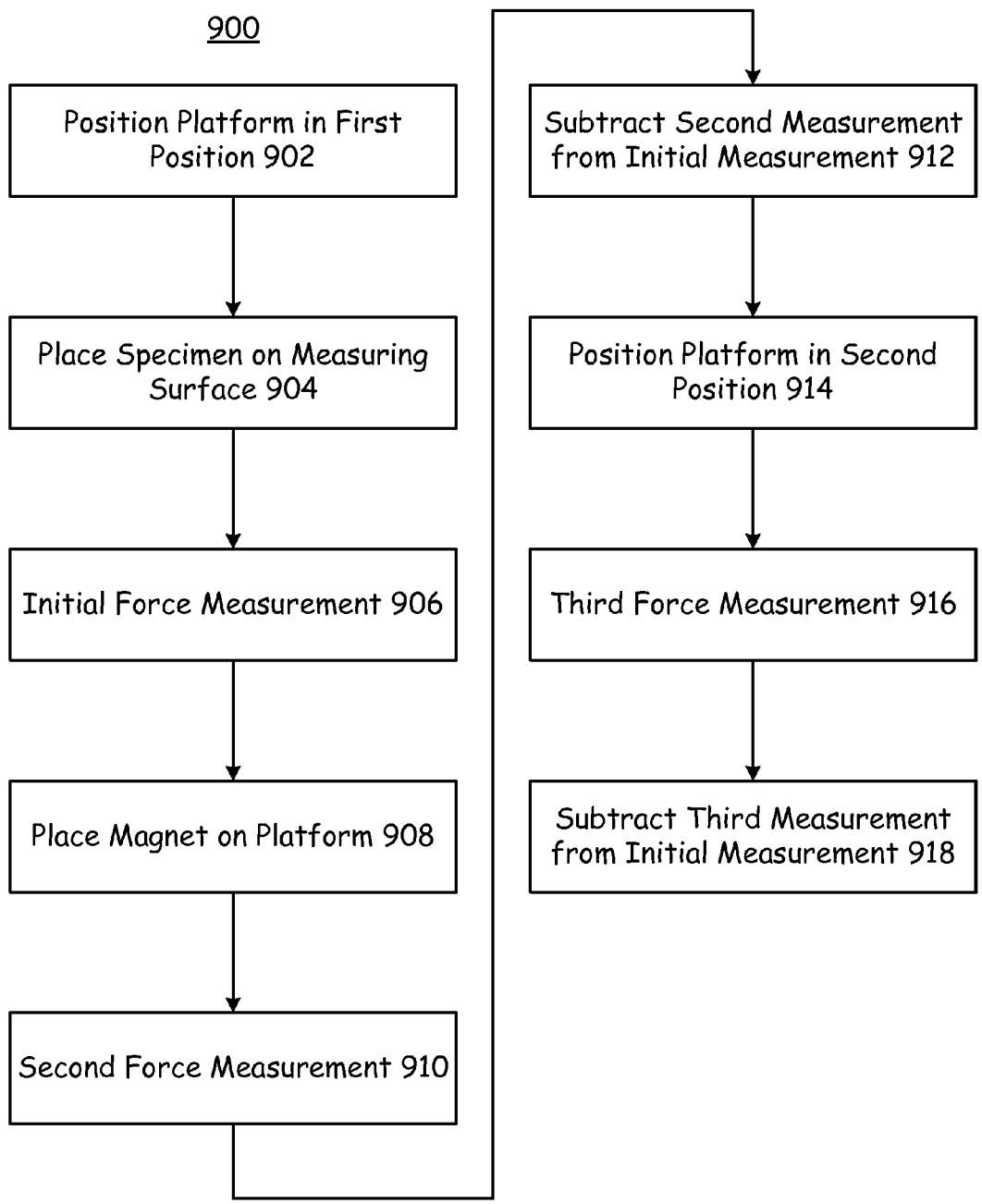
FIG. 9 is a flowchart of a method for determining the strength of a magnet according to an embodiment of the present invention.

Referring now to FIG. 9, there is depicted a flow chart of a method 900 according to an embodiment of the present invention. In the embodiment 900 of the testing procedure, the strength measurement apparatus 100 is used to determine the force (such as weight) applied by the specimen 102 against the force-sensing device 104 in the absence of any magnetic flux or attraction. This is accomplished by positioning the platform 106 in a first measurement position, such that at least a portion of the platform 106 is positioned vertically above a force-sensing device 104 with respect to gravity (Step 902).

The specimen 102 is placed onto the measuring surface 114 of the force-sensing device 104 (Step 904). Using the force-sensing device 104, an initial force measurement is taken to measure the amount of force acting on the force-sensing device 104 by the specimen 102 in the absence of a magnet 112 (Step 906). A magnet 112 is positioned onto the platform 106, such that the magnet 112 is positioned at a known distance vertically above at least a portion of the specimen 102 with respect to gravity (Step 908). Using the force-sensing device 104, a second force measurement (such as weight) of the specimen 102 is taken, to measure the amount of force acting on the force-sensing device 104 by the specimen 102 when the magnet 112 is present (Step 910).

The integral strength of the magnet 112 at the known height is determined by finding the difference between the initial force measurement reading and the second force measurement reading (Step 912). In some embodiments, the platform 106 is reconfigured to adjust the vertical distance between the specimen 102 and the magnet 112, such that the magnet 112 is positioned at a second distance vertically above at least a portion of the specimen 102 with respect to gravity (Step 914). A third measurement using the force-sensing device 104 is taken (Step 916). The integral strength of the magnet 112 at the second distance is determined by subtracting the third force measurement from the initial force measurement (Step 918). This process may be repeated to determine the integral strength of the magnet 112 at various heights. One or more such measurements with the magnet 112 at different distance can be used to compute an integral magnetic strength metric.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. An apparatus for determining an integral strength of a magnet, the apparatus comprising:
    a magnetically attractive specimen,
    a force-sensing device for receiving the specimen and determining,
        a magnitude of a first force applied by the specimen against the force-sensing device in the presence of the magnet, and
        a magnitude of a second force applied by the specimen against the force-sensing device in the absence of the magnet, and
    a platform for receiving the magnet and for positioning the magnet at a desired distance above the specimen.

2. The apparatus of claim 1, wherein the specimen comprises a material selected from the group consisting essentially of a diamagnetic material, a paramagnetic material, a ferromagnetic material, and an antiferromagnetic material.

3. The apparatus of claim 1, wherein the force-sensing device is one of a mass scale and a force gauge.

4. The apparatus of claim 1, wherein the platform further comprises a specimen tray for receiving and positioning the magnet.

5. The apparatus of claim 1, wherein the platform comprises a non-magnetically attractive material.

6. The apparatus of claim 1, wherein the platform receives and positions more than one magnet.

7. The apparatus of claim 1, further comprising adjustment means for varying the desired distance.

8. A method of determining the integral strength of a magnet, the method comprising the steps of:
    placing a magnetically attractive specimen onto a force-sensing device,
    measuring an initial force applied by the specimen against the force-sensing device, using the force-sensing device,
    positioning a magnet at a desired distance above the specimen and opposite the force-sensing device,
    measuring a second force applied by the specimen against the force-sensing device, using the force-sensing device, and
    comparing the initial force to the second force, thereby determining the integral strength of the magnet.

9. The method of claim 8 further comprising the steps of:
    positioning the magnet at a second distance above the specimen and opposite the force-sensing device,
    measuring a third force applied by the specimen against the force-sensing device, using the force-sensing device, and
    comparing the initial force to the third force, thereby determining the integral magnetic strength.

10. The method of claim 9, wherein the specimen comprises a material selected from the group consisting essentially of a diamagnetic material, a paramagnetic material, a ferromagnetic material, and an antiferromagnetic material.

11. The method of claim 9, wherein the force-sensing device is one of a mass scale and a force gauge.

12. The method of claim 9, wherein the magnet is positioned by an adjustable platform.

13. The method of claim 12, wherein the platform comprises a non-magnetically attractive material.

14. The method of claim 9, more than one magnet is measured simultaneously.

15. A method of determining the integral strength of a magnet, the method comprising the steps of:
    placing a magnetically attractive specimen onto a scale,
    measuring an initial weight of the specimen, using the scale,
    positioning a magnet at a desired distance above the specimen and opposite the scale,
    measuring a second weight of the specimen, using the scale,
    positioning the magnet at a second distance above the specimen and opposite the scale,
    measuring a third weight of the specimen, using the scale, and
    comparing the initial weight, the second weight, and the third weight, thereby determining the integral strength of the magnet, thereby producing the integral strength of the magnet.

16. The method of claim 15, wherein the specimen comprises a material selected from the group consisting essentially of a diamagnetic material, a paramagnetic material, a ferromagnetic material, and an antiferromagnetic material.

17. The method of claim 15, wherein the magnet is positioned by an adjustable platform.

18. The method of claim 17, wherein the platform comprises a non-magnetically attractive material.

19. The method of claim 15, more than one magnet is measured simultaneously.

* * * * *